United States Patent [19]
Gautier

[11] Patent Number: 5,982,062
[45] Date of Patent: Nov. 9, 1999

[54] ALTERNATOR INCLUDING ADAPTORS FOR RECTIFIER BRIDGE DIODES, IN PARTICULAR FOR A MOTOR VEHICLE, AND AN ADAPTOR FOR SUCH AN ALTERNATOR

[75] Inventor: Jean Gautier, St Barthélémy, France

[73] Assignee: Valeo Equipements Electriques Moteur, Creteil, France

[21] Appl. No.: 08/691,513

[22] Filed: Aug. 2, 1996

[30] Foreign Application Priority Data

Aug. 2, 1995 [FR] France ................... 95 09425

[51] Int. Cl.⁶ .................. H02K 11/04; H02K 11/00; H02M 7/06
[52] U.S. Cl. .................. 310/68 D; 363/141
[58] Field of Search .................. 310/68 D, 64; 363/141, 144, 145, 146; 257/692, 720, 730, 772

[56] References Cited

U.S. PATENT DOCUMENTS

| | | | |
|---|---|---|---|
| 2,942,165 | 6/1960 | Jackson et al. | 363/141 |
| 4,303,935 | 12/1981 | Ragaly | 363/141 |
| 4,532,539 | 7/1985 | Frister | 257/720 |
| 4,670,678 | 6/1987 | Jager et al. | 310/68 D |
| 4,980,588 | 12/1990 | Ogawa | 310/68 D |
| 5,424,594 | 6/1995 | Saito et al. | 310/68 D |

FOREIGN PATENT DOCUMENTS

| | | |
|---|---|---|
| 56010938 | 2/1981 | European Pat. Off. . |
| 0480 372 A1 | 4/1992 | European Pat. Off. . |
| 2 633 463 | 12/1989 | France . |
| 1 256 303 | 12/1967 | Germany . |

Primary Examiner—Clayton LaBalle
Attorney, Agent, or Firm—McCormick, Paulding & Huber LLP

[57] ABSTRACT

The invention provides an alternator for motor vehicles, in particular having a dissipator with one or more orifices designed to receive one or more press-fit diodes. An adaptor generally in the form of a disk has an outline enabling it to be engaged as a press-fit in a respective orifice of the dissipator. The adaptor has at least one plane face enabling a solder-mounting diode to be soldered thereto. The invention also includes the adaptor itself.

14 Claims, 2 Drawing Sheets

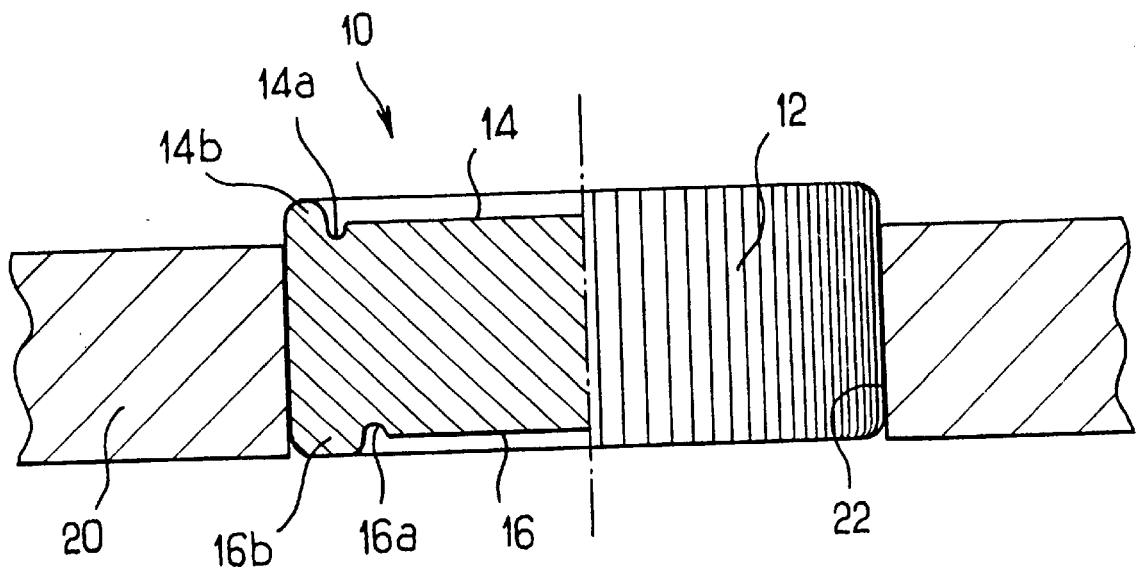
FIG_1
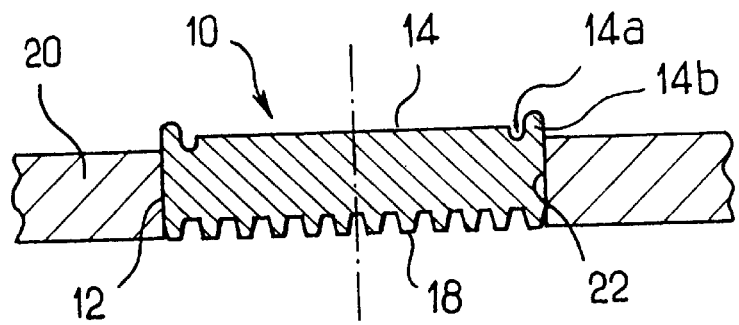
FIG_2
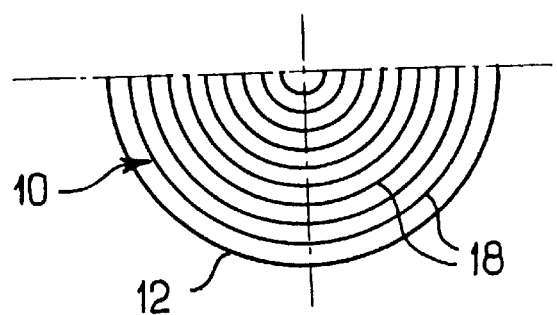
FIG_3

ALTERNATOR INCLUDING ADAPTORS FOR RECTIFIER BRIDGE DIODES, IN PARTICULAR FOR A MOTOR VEHICLE, AND AN ADAPTOR FOR SUCH AN ALTERNATOR

The present invention relates in general to alternators for motor vehicles, and more particularly to an improvement in the mounting of a rectifier bridge diodes on the back plate of such an alternator.

BACKGROUND OF THE INVENTION

In conventional manner, a polyphase alternator comprises a rectifier bridge constituted by a set of negative end diodes and by a set of positive end diodes. The positive end diodes are mounted on a positive dissipator, while the negative end diodes are mounted directly in the back plate, which acts both as a connection to ground and as a dissipator.

There are two main types of mounting for such diodes: press-fit and soldering. When negative end diodes are to be mounted in a metal back plate, e.g. made of aluminum alloy, however, soldering is out of the question. Given the heat capacity of the plate, such mounting would require an unreasonable amount of heat to be applied. The diodes must therefore necessarily be press-fit diodes, and that is disadvantageous, in particular because of the need to use a press, or because diode mounting then requires two different techniques to be used: soldering for positive diodes and pressing for negative diodes.

One solution to this problem consists in providing a negative dissipator onto which the negative end diodes are soldered, with the dissipator being fitted to the back plate.

That solution is also disadvantageous since it requires a special design of back plate plus an additional part, i.e. the fitted-on negative dissipator, and it increases the axial size of the alternator.

It results from the above discussion that depending on the technique used for mounting negative diodes, it is necessary to resort to two back plates of different types, which is also disadvantageous, in particular for standardizing manufacture.

OBJECTS AND SUMMARY OF THE INVENTION

The present invention seeks to mitigate this drawback and to make it possible to use a single back plate both for solder mounting of negative diodes and for press-fit mounting of negative diodes.

Thus, in a first aspect, the present invention provides an alternator, in particular for a motor vehicle, the alternator being of the type comprising dissipator means including one or more orifices designed to receive one or more press-fit diodes, wherein the, or each, orifice includes a respective adaptor engaged as a press-fit therein, and being generally in the form of a disk having an outline suitable for such press-fit engagement and at least one plane face on which a solder-mounting diode is soldered.

Preferably, the dissipator means is constituted by a metal back plate of the alternator.

The invention also provides an adaptor for a rectifier bridge dissipator of an alternator, in particular for a motor vehicle, said adaptor being generally in the form of a disk having an outline enabling it to be engaged as a press-fit in an orifice of the dissipator that is designed to receive a diode as a press-fit, and also having at least one plane face enabling a solder-mounting diode to be soldered thereto.

Thus, press-fit diodes may be pressed directly into appropriate orifices of the back plate in conventional manner. Solder-mounting diodes on the other hand may be initially soldered to the adaptors and then the adaptors carrying the diodes may be pressed into the identical orifices. In both cases, the sequence of operations required for assembling the alternator can be exactly the same.

Preferred but non-limiting features of the alternator and the adaptor of the invention are the following:

the adaptor may include two opposite plane faces enabling it to be soldered to either of two types of solder-mounting diodes;

the two opposite plane faces may be of different diameters;

the adaptor may alternatively a single plane face for soldering, and on its opposite side it may have depressions or projections for dissipating heat;

the, or each, plane face may be set back and surrounded by a flange for centering the diode; and a peripheral groove may be provided between the, or each, plane face and the associated flange to limit shear stresses during soldering.

BRIEF DESCRIPTION OF THE DRAWINGS

Other features, objects, and advantages of the present invention will appear more clearly on reading the following detailed description of preferred embodiments of the invention, given by way of non-limiting example and described with reference to the accompanying drawings, in which:

FIG. 1 is a view, half in axial section and half in side elevation, showing an adaptor comprising a first embodiment of the invention;

FIG. 2 is an axial sectional view of an adaptor comprising a second embodiment of the invention;

FIG. 3 is a half-view from beneath the FIG. 2 adaptor;

DETAILED DESCRIPTION

Figure 4:
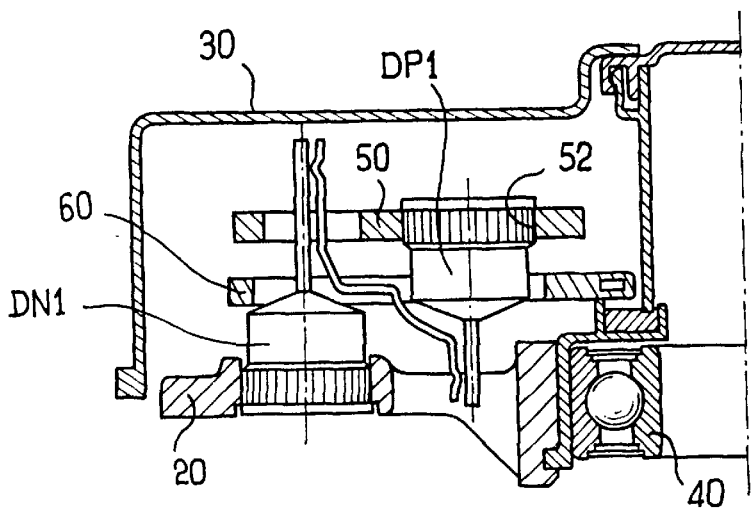
FIG. 4 is a fragmentary axial sectional view of an alternator having press-fit rectifier diodes.

With reference initially to FIG. 1, there is shown an adaptor of the invention given overall reference 10, which is generally in the form of a thick disk with its circumference 12 provided with shallow axial fluting to enable it to be engaged by means of a press fit in an orifice of a dissipator designed to receive a power diode of the force-fit type. The diameter and the shape and size of the fluting are therefore preferably very close to the diameter and the shape and size of the fluting of such a power diode.

The adaptor 10 has a plane top face 14 and a plane bottom face 16. Each of these faces is set back a little from the total axial extent of the adaptor, being surrounded by a respective peripheral flange 14b or 16b. In addition, the transition between each plane face 14, 16 and the associated flange 14b, 16b has a respective annular groove 14a, 16a of relatively small section.

The dimensions of the set back plane face 14 in terms of diameter and depth are preferably suitable for it to receive a standard solder-mounting power diode of the type commonly referred to as a "button can" diode.

The dimensions of the set back plane face 16, likewise in terms of diameter and depth, are preferably suitable for receiving an inverted standard solder-mounting power diode of the type commonly referred to as a "potted can" diode. Consequently, its diameter is slightly smaller than the diameter of the face 14.

The peripheral flanges 14*b* and 16*b* aid in centering the respective types of diodes when they are to be soldered to the adaptor, while the purpose of the grooves 14*a* and 16*a* is to limit shear stresses on the respective plane faces 14 and 16 on which the soldering takes place.

The adaptor 10 is preferably made of an alloy of copper, aluminum, or brass, with surface treatment (tinning, etc. . . . ) enabling the diode to be soldered and providing protection against corrosion. The manufacturing technique may, in particular, be machining or molding.

Thus, the adaptor 10 can be used for mounting a rectifier solder-mounting diode in an orifice 22 of a dissipator, in particular a back plate 20, of a vehicle alternator, the orifice being initially designed to receive a press-fit diode.

The adaptor 10 is press-fit in the above-mentioned orifice, one way round or the other, depending on the type of diode to be soldered (button can or potted can).

Without requiring any change in its design, a single design of dissipator can therefore be used equally well:

with standard press-fit diodes; and with two different types of solder-mounting diodes.

With reference now to FIGS. 2 and 3, there is shown a second embodiment of the adaptor of the invention.

In addition to the circumferential fluting 12, it has only one plane face 14 surrounded by its groove 14*a* and its flange 14*b*.

On its opposite face, the adaptor is provided with a series of concentric ribs 18. When the adaptor has been mounted in an alternator back plate, this face is exposed to the alternator's internal flow of ventilation air, and the ribs 18, or any other appropriate projections or depressions, increase the heat exchange area, and also cause turbulence in the air, both of which phenomena serve to improve the removal of heat generated by the diode soldered to the adaptor.

With reference now to FIG. 4, there is shown a portion of the back end of an alternator. Back plate 20 receives a shaft ball bearing 40, a cap 30, a positive dissipator 50 and are mounted on the back plate by electrically insulating means. A member 60 interconnects the six rectifier diodes of a three-phase alternator, and also connects them to the stator winding and to the output terminals.

In FIG. 4, both positive end diodes DP1 and negative end diodes DN1 are of the force-fit type.

The diodes DN1 are engaged directly in the orifices or sockets 22 in the back plate 20 while the diodes DP1 are engaged in orifices or sockets 52 in the positive dissipator 50.

Figure 5:
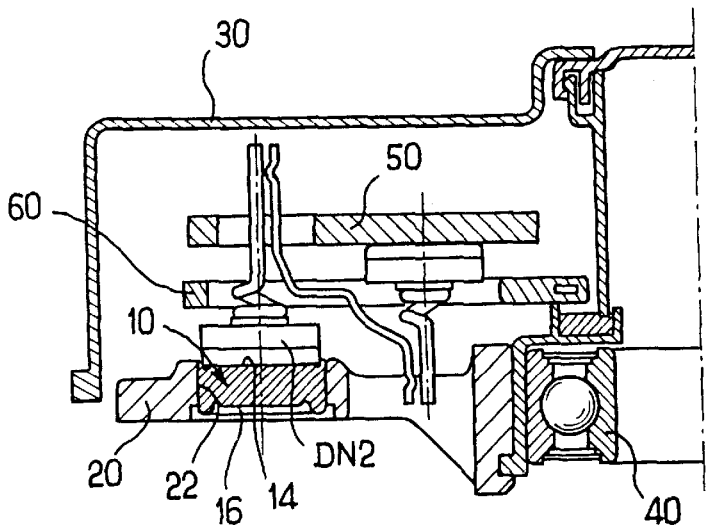
FIG. 5 is a fragmentary axial sectional view of an alternator having solder-mounting rectifier diodes of a first type.

FIG. 5 shows the same view but with a rectifier bridge constituted by solder-mounting diodes of the button can type having a housing or first adaptor for soldering.

Positive diodes DP2 are soldered to the surface of positive dissipator 50, while orifices 22 in the back plate 20 receive second adaptors 10 of the type having a housing or first adaptor for soldering described with reference to FIG. 1. The negative diodes DN2 are soldered to adaptors 10.

It may be observed at this point that the back plate 20 is exactly identical to the back plate of FIG. 4.

Figure 6:
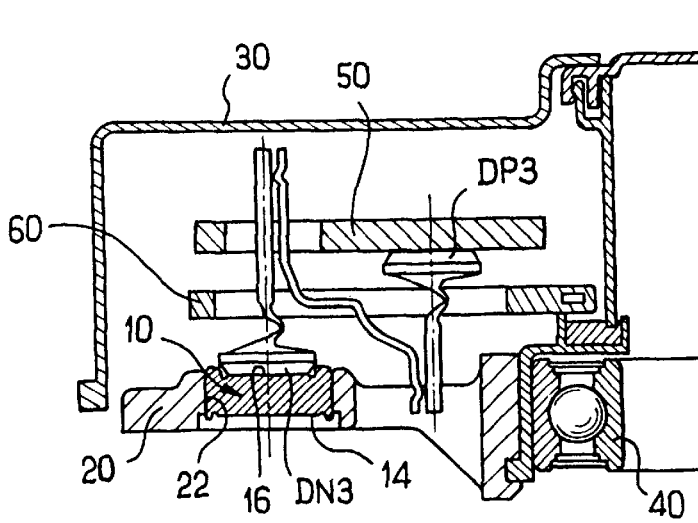
FIG. 6 is a fragmentary axial sectional view of an alternator having solder-mounting rectifier diodes of a second type.

In FIG. 6, a rectifier bridge is made up of solder-mounting diodes of the potted can type. Positive diodes DP3 are soldered directly to the surface of the positive dissipator 50, while the negative diodes DN3 are soldered to adaptors 10 identical to those of FIG. 5, but reversed through 180° so as to have their faces 16 suitable for receiving this type of diode facing the outside. In this case also, the back plate 20 can be exactly identical to the back plates of FIGS. 4 and 5.

Naturally, the present invention is not limited in any way to the embodiments described and shown, and the person skilled in the art will be able to apply any variant or modification within the spirit of the invention.

I claim:

1. An alternator, in particular for a motor vehicle, the alternator comprising dissipator means including one or more orifices designed to receive one or more diodes each having a press-fit type housing, wherein each orifice includes an adaptor in press-fit engagement therein, said adaptors being generally in the form of a disk each having an outline substantially identical with that of the aforesaid diodes and in press-fit engagement in an orifice, each adaptor also having at least one planar face on which a diode having a solder mounting type housing is soldered.

2. An alternator according to claim 1, wherein the dissipator means are constituted by a metal back plate of the alternator.

3. An alternator according to claim 1, wherein the, or each, adaptor includes two opposite plane faces enabling it to be soldered to either of two types of solder-mounting diode.

4. An alternator according to claim 3, wherein the two opposite plane faces are of different diameters.

5. An alternator according to claim 1, wherein the, or each, adaptor has a single plane face for soldering and, on its opposite side, depressions or projections for heat dissipation.

6. An alternator according to claim 1, wherein the, or each, plane face is set back, being surrounded by a diode-centering flange.

7. An alternator according to claim 6, wherein a peripheral groove is provided between the, or each, plane face and the associated flange, said groove limiting shear stresses during soldering.

8. An adaptor according to claim 1, including a single plane face for soldering, and, on the opposite side, recesses or projections for heat dissipation.

9. An adaptor according to claim 1, wherein the, or each, plane face is set back, being surrounded by a diode-centering flange.

10. An adaptor according to claim 9, wherein a peripheral groove is provided between the, or each, plane face and the associated flange, the groove serving to limit shear stresses during soldering.

11. An adaptor for a rectifier bridge dissipator in an alternator, in particular for a motor vehicle, said adaptor being generally in the form of a disk having an outline enabling it to be press-fit in an orifice of the dissipator which is designed to receive a diode having a press-fit type housing, and said adaptor also having at least one planar face enabling a diode having a solder-mounting type housing to be soldered thereto.

12. An additional adaptor according to claim 11, including two opposite plane faces enabling it to be soldered to either of two types of solder-mounting diode.

13. An adaptor according to claim 12, wherein the two opposite plane faces are of different diameters.

14. An alternator, in particular for a motor vehicle, the alternator comprising dissipator means including at least one orifice designed to receive a press fit type diode housing, a diode adaptor generally in the form of a disk substantially identical with the aforesaid diode housing and suitable for press-fit engagement in the orifice and having at least one planar face on which a solder type diode housing is soldered.

* * * * *